US008934239B2

(12) United States Patent
Zhou

(10) Patent No.: US 8,934,239 B2
(45) Date of Patent: Jan. 13, 2015

(54) BASE AND ELECTRONIC APPARATUS USING THE SAME

(75) Inventor: Cong-Bing Zhou, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 498 days.

(21) Appl. No.: 13/278,063

(22) Filed: Oct. 20, 2011

(65) Prior Publication Data

US 2012/0229967 A1 Sep. 13, 2012

(30) Foreign Application Priority Data

Mar. 8, 2011 (CN) ......................... 201110054741.4

(51) Int. Cl.

| | |
|---|---|
| ***H05K 5/00*** | (2006.01) |
| ***H05K 7/00*** | (2006.01) |
| ***G11B 33/02*** | (2006.01) |
| ***A47G 1/10*** | (2006.01) |
| ***E04G 1/10*** | (2006.01) |
| ***A47B 96/06*** | (2006.01) |
| ***H01R 13/72*** | (2006.01) |
| *H01R 31/06* | (2006.01) |

(52) U.S. Cl.

CPC ................ *H01R 13/72* (2013.01); *H01R 31/06* (2013.01)

USPC ............ 361/679.56; 361/679.57; 361/679.58; 361/679.14; 361/679.41; 361/679.42; 361/679.43; 361/679.44; 369/75.21; 248/316.5; 248/292.14; 292/8; 292/4; 292/341.17

(58) Field of Classification Search

CPC ..... G06F 1/16; G06F 1/33225; H05K 5/0026; H05K 5/026; H05K 2201/10159

USPC ............... 361/679.01–679.45, 679.55–679.6, 361/724–747; 369/330.93–30.98, 75.1, 369/75.2, 75.11, 75.21, 76, 77.11, 77.21, 369/78, 79, 80, 81, 82; 248/917–924, 248/80–88, 155.1–155.5, 166–173, 248/180.1–186.2, 229.1–231.51, 271.4, 248/292.14, 316.1–316.8; 292/1–62, 113, 292/169.11–169.23, 341.11–341.19

See application file for complete search history.

(56) References Cited

U.S. PATENT DOCUMENTS 6,129,318 A * 10/2000 Paulse ........................ 248/118.3
6,392,635 B1 * 5/2002 Snyder .......................... 345/163

* cited by examiner

*Primary Examiner* — Jerry Wu

(74) *Attorney, Agent, or Firm* — Novak Druce Connolly Bove + Quigg LLP

(57) ABSTRACT

A base capable of containing a data cable includes a housing, and a winding mechanism. The data cable has a first connector plug, a second connector plug and a transmitting wire connecting between them. The housing defines an opening. The winding mechanism is received in the housing and has a winding member and a driving member. The winding member is rotatably mounted inside the housing, the driving member is fixed on the driving member. The first connector plug is passed through the housing via the opening, the driving member generates an elastic force if the transmitting wire is pulled out to connect to another device. The driving member automatically rewinds the transmitting wire when the external connection is not required.

16 Claims, 6 Drawing Sheets

BASE AND ELECTRONIC APPARATUS USING THE SAME

BACKGROUND

1. Technical Field

The present disclosure relates to bases, and particularly to a base for an electronic device and an electronic apparatus using the base.

2. Description of Related Art

Electronic devices, such as a mobile phone, a media player, and a personal digital assistant (PDA) generally include video playing and data transmitting functions. However, users need to hold such electronic devices to view the video. Furthermore, the electronic device may need a data cable detachably coupled to the electronic device to receive or transmit data from or to another electronic device. So, it is inconvenient for the users to use the electronic device.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
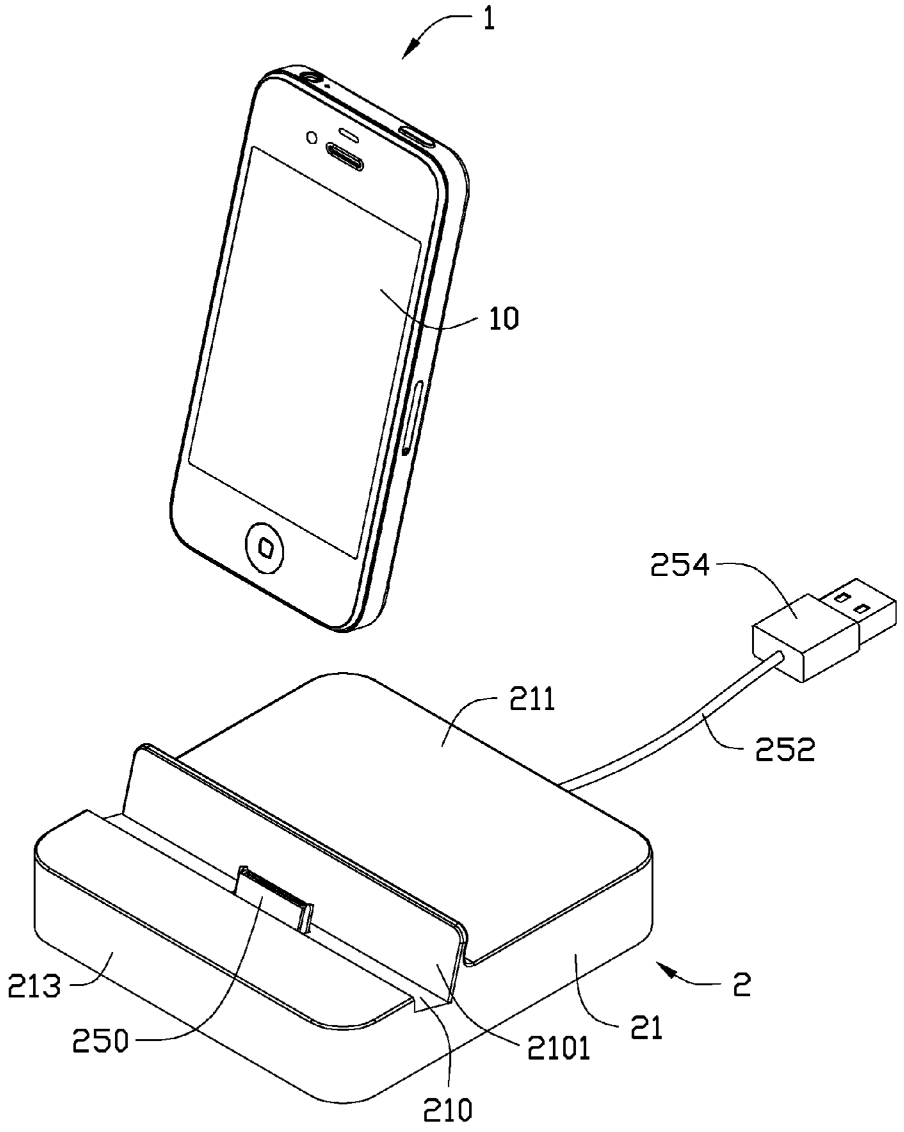
FIG. 1 is an exploded view of an electronic apparatus with a base.

Referring to FIG. 1, an electronic apparatus includes a base 2, for loading an electronic device 1. The electronic device 1 may be a mobile phone, a MP4 player, a PDA (personal digital assistant) and the like. The main body 10 of the electronic device 1 include a connector slot (not shown) disposed on the bottom wall of the main body 10. In another embodiment, the connector slot can also be disposed on a side or top wall of the main body 10.

Figure 2:
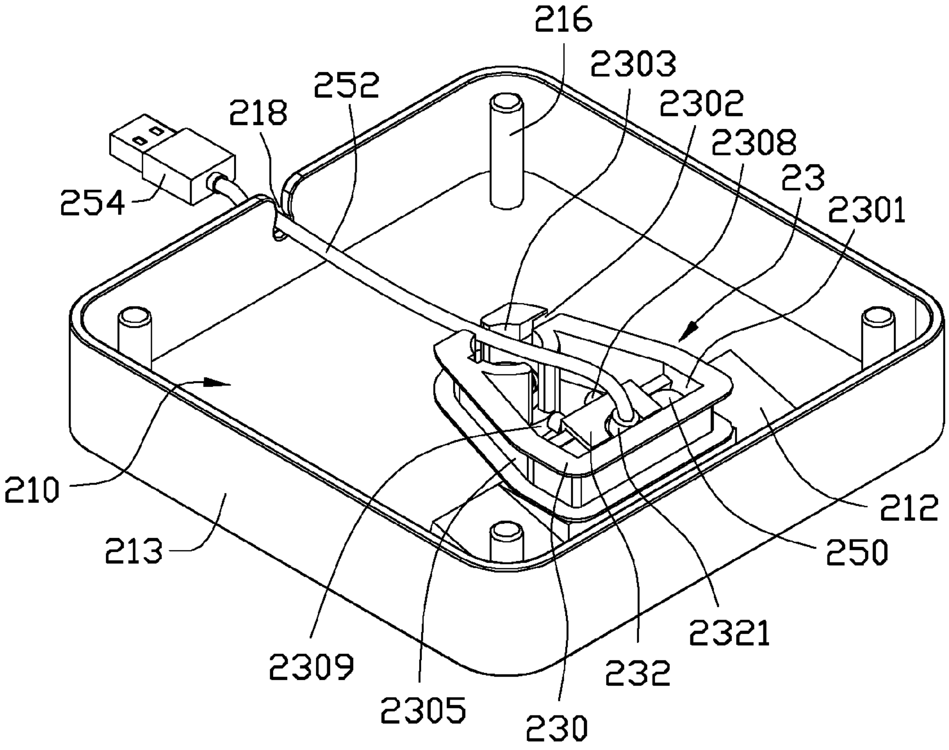
FIG. 2 is bottom view of the base in FIG. 1.
Figure 3:
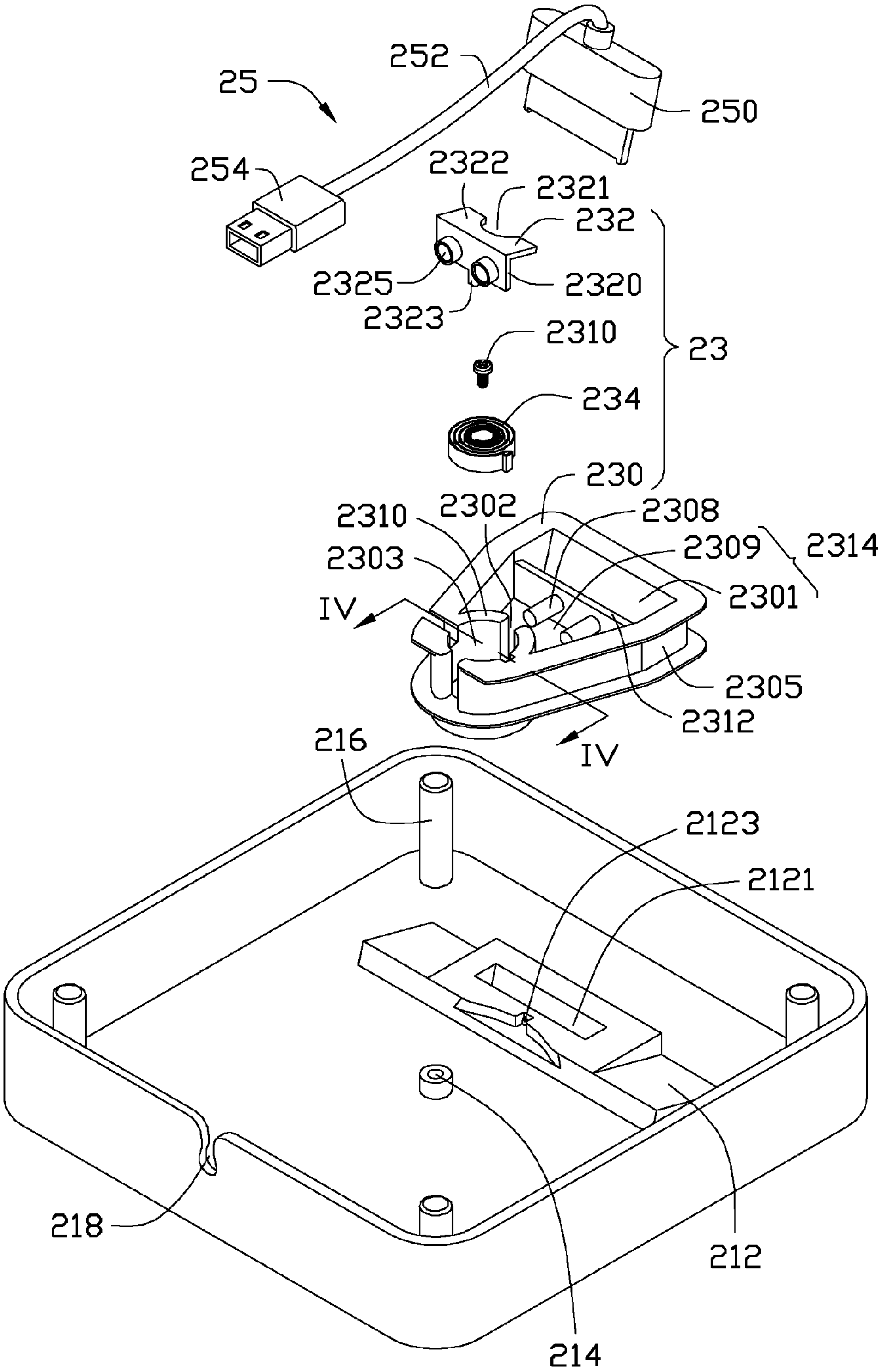
FIG. 3 is an exploded view of the base in FIG. 2.

Referring to FIGS. 2 and 3, the base 2 includes a housing 21, a winding mechanism 23, and a data cable 25. The winding mechanism 23 is received in the housing 21. The data cable 25 may be wound or coiled around the winding mechanism 23.

The data cable 25 is for connecting the electronic device 1 to another electronic device (not shown), for the exchange of data between the electronic device 1 and the other electronic device. The data cable 25 includes a first connector plug 250, a second connector plug 254, and a transmitting wire 252 connected between the first connector plug 250 and the second connector plug 254. The first connector plug 250 is capable of being coupled to the connector slot of the electronic device 1. The second connector plug 254 is capable of being coupled to the other electronic device. In the embodiment, the first connector plug 250 is different from the second connector plug 254. The first connector plug 250 is a 30 pin plug, and the second connector plug 254 is a USB plug. In another embodiment, the first connector plug 250 and the second connector plug 254 may be the same type of connector plug.

The housing 21 includes a rectangular top wall 211, four side walls 213 perpendicularly extending from the four edges of the top wall 211, and a cavity 210 defined by the top wall 211 and the side walls 213 for receiving the winding mechanism 23. One of the side walls 213 defines a first gap 218.

The external surface of the top wall 211 defines a long and narrow inserting recess 210 for receiving and electrically connecting the electronic device 1. The inserting recess 210 extends the width of the top wall 211. The top wall 211 presents a support board 2101, protruding from the external surface of the top wall 211, for supporting the electronic device 1. The support board 2101 rises out of the inserting recess 210, and includes an inclined surface (not labeled) facing the recess 210. The inclined surface is inclined away from the recess 210.

The underside of the top wall 211 presents a convex stage 212, a pivot 214, and four supporting legs 216. The convex stage 212, the pivot 214, and the four supporting legs 216 all protrude from the inner surface of the top wall 211. The four support legs 216 are at the four corners of the top wall to support the housing 21. The convex stage 212 and the pivot 214 together enable the winding mechanism 23 to be mounted to the housing 21.

The convex stage 212 defines an opening 2121 and a grasping notch 2123. The opening 2121 is in the central section of the convex stage 212 and communicates with the inserting recess 210. The opening 2121 allows the first connector plug 250 to pass through the top wall 211 to couple to the connector slot of the electronic device 1. The grasping notch 2123 is attached on one side of the convex stage 212. The pivot 214 locates on one side of the convex stage 212, and faces the grasping notch 2123.

The winding mechanism 23 includes a winding member 230, a locking member 232, and a driving member 234. One end of the winding member 230 pivots on the pivot 214, the other end of the winding member 230 is attached on the convex stage 212. The driving member 234 is mounted to the winding member 230 and the housing 21 to drive the winding member 230 to rotate and carry the transmitting wire 252 with it. The locking member 232 is mounted to the winding member 230 and the housing 21 to lock the winding member 230 to the housing 21.

Figure 4:
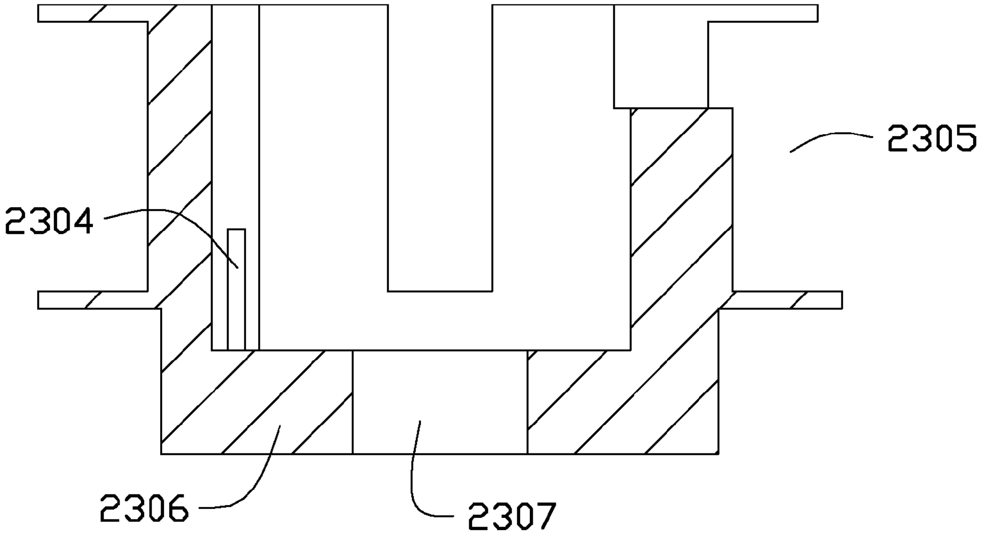
FIG. 4 is a cross-sectional view taken along the line IV-IV of the base in FIG. 3.
Figure 5:
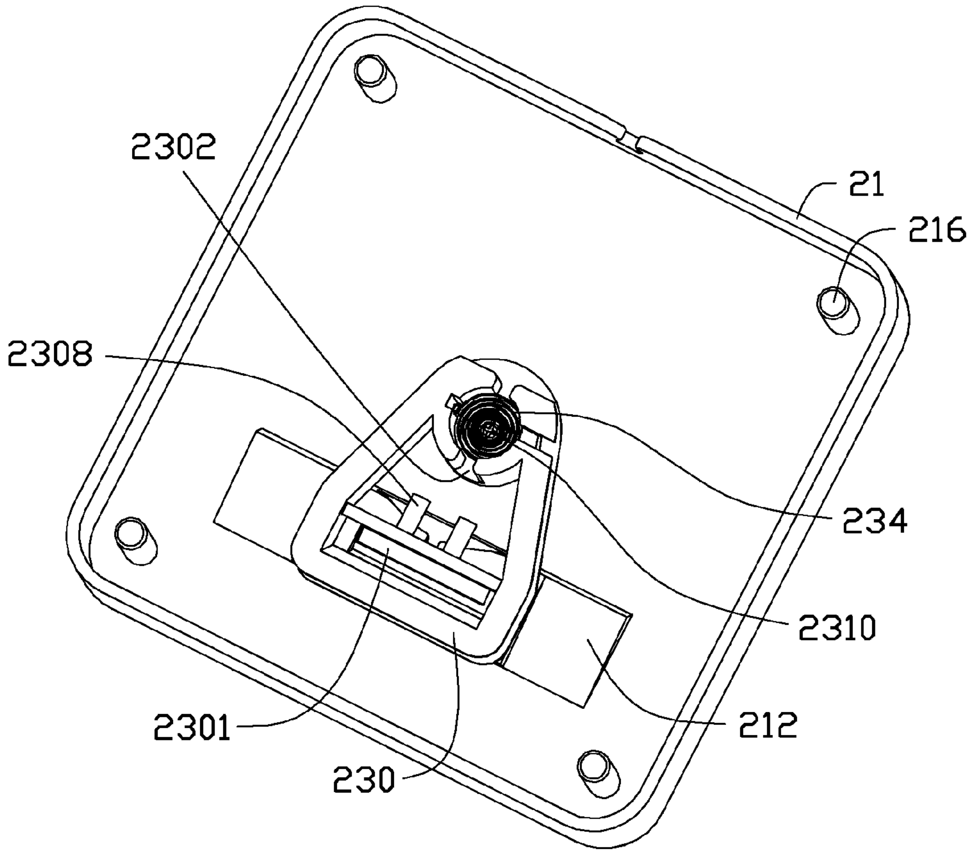
FIG. 5 is a view of part of the base in FIG. 2.
Figure 6:
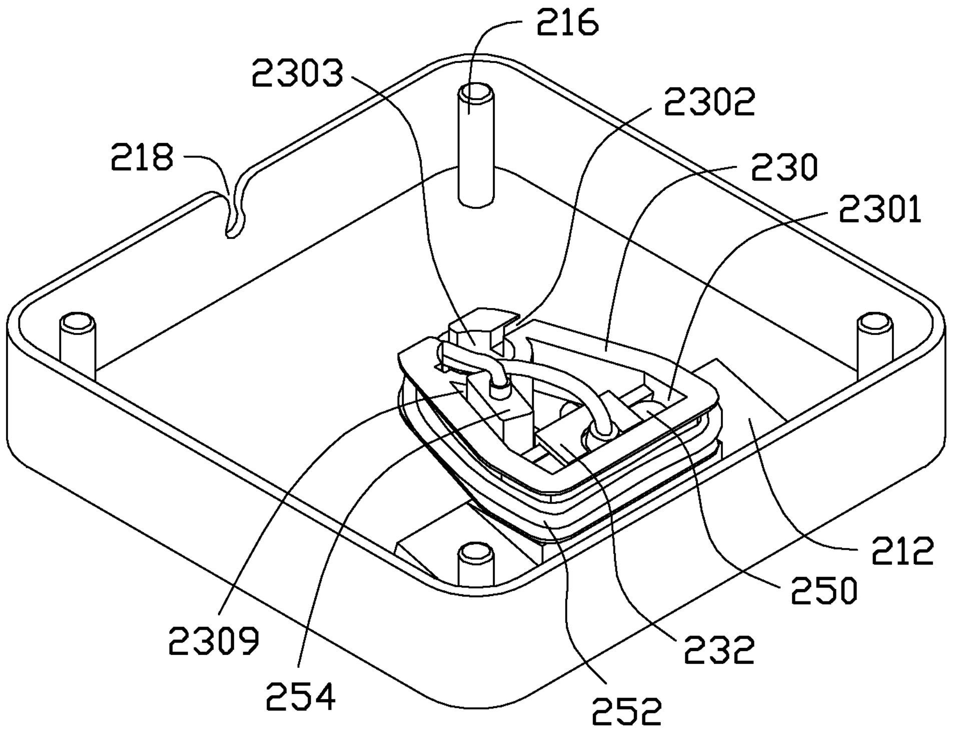
FIG. 6 is a bottom view showing the data cable wound.

Referring to FIG. 4 also, the winding member 230 further defines a hollow space 2314 and a groove 2305 and presents a pivot part 2306, a receiving part 2310, and a partition board 2312. The pivot part 2306 protrudes from the bottom of the winding member 230 and is located on one end of the winding member 230. The pivot part 2306 is in a shape of a column and defines a pivot hole 2307. The pivot part 2306 pivots on the pivot 214 via the pivot hole 2307, the height of the pivot part 2306 is higher than that of the convex stage 212 in the longitudinal direction of the housing 21, thus the winding member 230 is capable of rotating relative to the housing 21. The receiving part 2310 extends from the pivot part 230 toward the top of the winding member 230, and the receiving part 2310 is placed in a hollow space 2314 and a receiving space 2303 is formed by the receiving part 2310. The receiving part 2310 defines a plurality of second gaps 2302 communicating with the receiving space 2303 and the hollow space 2314.

The partition board 2312 is located in the hollow space 2314 and divides the hollow space 2314 into a first receiving groove 2301 and a second receiving groove 2309. Two fastening elements 2308 perpendicularly protrude from the partition board 2312 towards the receiving part 2310, and are received in the second receiving groove 2309. The first receiving groove 2301 is in alignment with the opening 2121 of the housing 21, and is capable of receiving the first connector plug 250. The second receiving groove 2309 is capable of receiving the second connector plug 252. The groove 2305, which goes all the way around the winding member 230, functions as a reel or spool for receiving the transmitting wire 252 when the transmitting wire 252 is wound by the winding member 230.

The winding member 230 further sets a fixed shaft 2304. The fixed shaft 2304 protrudes from the pivot part 2306 and is in the receiving space 2303.

The locking member 232 includes a first basic board 2320 and a second basic board 2322 protruding from the first basic board 2320. The first basic board 2320 presents two cylindrical sleeves 2325 and a buckling part 2323 protruding from the second basic board 2302. The sleeves 2325 are sleeved on the fastening elements 2308 of the winding member 230 and may slide along the fastening elements 2308. The buckling part 2323 is away from the second basic board 2322 and is inserted into the grasping notch 2123 of the housing 21. The second basic board 2322 covers above the first receiving groove, and defines a locking notch 2321.

The driving member 234 is received in the receiving space 2303. The driving member 234 is an elastomer, and is wound clockwise to form a coil. The two opposite ends of the driving member 234 are bent into small cylinders. The end of the driving member 234 in the center of the coil is secured to the pivot 214 of the housing 21 via a screw 2310. The other outer end of the driving member 234 is secured on the fixed shaft 2304.

To assemble the base 2, the first connector plug 250 is passed through the first receiving groove 2301 of the winding mechanism 23 and the opening 2121 of the housing 21 so that the first connector plug 250 extends outside the housing 21. The locking member 232 is slid to the partition board 2312 along the fastening elements 2308 to lock the first connector plug 250 and the transmitting wire 252 in the locking notch 2321 and the buckling part 2323 is clasped in the grasping notch 2123. At this time, the locking member 232 enables the winding member 230 to lock into the housing 21. The transmitting wire 252 is wound around the winding member 230 and received in the groove 2305. The second connector plug 254 is clasped between one of the fastening elements 2308 and the receiving part 2310. As the data cable 250 is received in the housing 21 in this way, the assembly of the base 2 is finished.

When the data cable 25 is to be connected to another electronic device, the locking member 232 is slid away from the partition board 2312 to unclasp the buckling part 2323 from the grasping notch 2123. The second connector plug 254 is pulled from the second receiving groove 2309 and the transmitting wire 254 may be unwound. At the same time, the first connector plug 250 is pulled out of the opening 2121 into the first receiving groove 2301 and the winding member 230 is unlocked. The winding member 230 is spun anti-clockwise by virtue of the tension in the driving member 234. Even when the transmitting wire 252 has been fully drawn out, the winding member 230 is locked into the housing 21 again by the means described above. The transmitting wire 252 is passed through the first gap 2302 and through the second gap 218 to extend out of the housing 21, and at this point, the second connector plug 254 is capable of being coupled to the other electronic device.

When the data cable 25 is not being used, and the second connector plug 254 is freed from another electronic device, the winding member 230 is unlocked from the housing 21 again by the means described above. The winding member 230 automatically rewinds to re-coil the transmitting wire 252 under elastic force.

As described above, in being supported by the base 2 instead of being held in the hand, the viewing of the electronic device 1 is easier and more convenient. Further, the automatic regathering and rewinding of the data cable 25 into the housing 21 of the base 2 avoids any carrying and storage difficulties concerning the data cable 25.

It is to be understood, however, that even though relevant information and the advantages of the present embodiments have been set forth in the foregoing description, together with details of the functions of the present embodiments, the disclosure is illustrative only; and changes may be made in detail, especially in the matters of shape, size, and arrangement of parts within the principles of the present embodiments to the full extent indicated by the broad general meaning of the terms in which the appended claims are expressed.

What is claimed is:

1. A base capable of receiving a data cable, the data cable having a first connector plug, a second connector plug and a transmitting wire connecting between the first connector plug and the second connector plug; the base comprising:

a housing defining an opening, and a winding mechanism received in the housing and having a winding member and a driving member, the winding member being rotatably mounted inside the housing, the driving member being arranged on the winding member; and a locking member, the locking member defines a locking notch; and the winding member comprises a partition board, the partition board is located across a hollow space, defined in the winding member, to divide the hollow space into a first receiving groove and a second receiving groove, the partition board sets two fastening elements extending into the second receiving groove, the locking member slides along the fastening elements to grasp the transmitting wire in the locking notch and lock the winding member;

wherein the first connector plug is received in the winding member and the opening, and a partial of the first connector plug is passed through the housing via the opening for connecting with an external electronic device; the first connector plug received in the opening is capable of being pulled out of the opening to be received in the winding member for allowing the winding member to be unlock and rotated, the driving member is capable of generating an elastic force if the winding member rotates in a first direction by applying an external force when the first connector plug is received in the winding member, the driving member is also capable of driving the winding member to rotate in a second direction opposite to the first direction to rotate to enable the transmitting wire to wind around the winding member if the external force is released.

2. The base of claim 1, wherein the partial of the first connector plug passed through the housing is orderly passed though the winding member and the housing via the first receiving groove and the opening.

3. The base of claim 1, wherein the housing comprises a top wall and side walls protruding from the top wall and around the top walls, the top wall sets a convex stage and a pivot protruding from the rear surface of top wall, one end of the winding member is pivoted about the pivot, and the other end of the winding member is attached on the convex stage.

4. The base of claim 3, wherein the winding member further sets a pivot part, the pivot part protrudes from the bottom of the winding member, and the pivot part defines a pivot hole, the pivot is passed thought the pivot hole.

5. The base of claim 4, wherein the winding member further sets a receiving part, the receiving part protrudes from the pivot part and around the edge of the pivot part, the receiving part defines a receiving space for receiving the driving element, the second receiving groove is between the partition board and the receiving part.

6. The base of claim 5, wherein the winding member further sets a fixed shaft for fixing the driving element, the fixed shaft protrudes from the bottom of the receiving part and is located in the receiving space.

7. The base of claim 6, wherein the driving element is made of elastic material.

8. The base of claim 7, wherein the driving element is wound as a coil, one end of the driving element is located at the center of the coil and is passed through the receiving part and the pivot part to be secured to the housing, the other end of the driving element is located at the periphery of the driving element and is fixed on the fixed shaft of the winding member.

9. An electronic apparatus comprising:

an electronic device, and a base for attaching to the electronic device, the base capable of receiving a data cable, the data cable having a first connector plug, a second connector plug and a transmitting wire connecting between the first connector plug and the second connector plug; the base comprising:

a housing defining an opening; and a winding mechanism received in the housing and having a winding member and a driving member, the winding member being rotatably mounted inside the housing, the driving member being arranged on the winding member; and a locking member, the locking member defines a locking notch; and the winding member comprises a partition board, the partition board is located across a hollow space, defined in the winding member, to divide the hollow space into a first receiving groove and a second receiving groove, the partition board sets two fastening elements extending into the second receiving groove, the locking member slides along the fastening elements to grasp the transmitting wire in the locking notch and lock the winding member;

wherein the first connector plug is received in the winding member and the opening, and a partial of the first connector plug is passed through the housing via the opening to electrically couple to the electronic device; the first connector plug is capable of being pulled out of the opening to be received in the winding member for allowing the winding member to be unlocked and rotated, the driving member is capable of generating an elastic force if the winding member rotates in a first direction by applying an external force when the first connector plug is received in the winding member, the driving member is also capable of driving the winding member to rotate in a second direction opposite to the first direction to rotate to enable the transmitting wire to wind around the winding member if the external force is released.

10. The electronic apparatus of claim 9, wherein the housing comprises a top wall and side walls protruding from the top wall and around the top walls, the top wall sets a convex stage and a pivot protruding from the inner surface of top wall, one end of the winding member is pivoted to the pivot, and the other end of the winding member is attached on the convex stage.

11. The electronic apparatus of claim 10, wherein the winding member further sets a pivot part, the pivot part protruding from the bottom of the winding member, and the pivot part defines a pivot hole, the pivot is passed thought.

12. The electronic apparatus of claim 11, wherein the winding member further sets a receiving part, the receiving part protrudes from the pivot part and around the edge of the pivot part, the receiving part defines a receiving space for receiving the driving element, the second receiving groove is between the partition board and the receiving part.

13. The electronic apparatus of claim 12, wherein the winding member further sets a fixed shaft for fixing the driving element, the fixed shaft protrudes from the bottom of the receiving part and is allocated in the receiving space.

14. The electronic apparatus of claim 13, wherein the driving element is made of elastic material.

15. The electronic apparatus of claim 14, wherein the driving element is wound as a coil, one end of the driving element is located at the center of the coil and is passed through the receiving part and the pivot part to be secured to the housing, the other end of the driving element locates at the periphery of the driving element and is fixed on the fixed shaft of the winding member.

16. An electronic apparatus comprising:

an electronic device, and a base for attaching to the electronic device, the base capable of receiving a data cable, the data cable having a first connector plug, a second connector plug and a transmitting wire connecting between the first connector plug and the second connector plug; the base comprising:

a housing defining an opening located on a top wall and a first gap located on a front side wall; and a winding mechanism received in the housing comprising a winder member; and a locking member, the locking member defines a locking notch; and the winding member comprises a partition board, the partition board is located across a hollow space, defined in the winding member, to divide the hollow space into a first receiving groove and a second receiving groove, the partition board sets two fastening elements extending into the second receiving groove, the locking member slides along the fastening elements to grasp the transmitting wire in the locking notch and lock the winding member to the housing;

wherein the winding mechanism comprises a driving member, the winding member is being rotatably mounted inside the housing; the second receiving groove further defines a second gap communicated with the first receiving groove; the driving member is received in the second receiving groove, a partial of the first connector plug is exposed from the housing via passing through the first receiving groove and the opening and locked the winding member, and the transmitting wire is grasped by the first gap and the second gap for making the second connector plug to be exposed from the housing on the front side wall; and the second connector plug is capable of rotating to be received in the second receiving groove.

* * * * *